(12) United States Patent
Liu et al.

(10) Patent No.: US 6,362,975 B1
(45) Date of Patent: Mar. 26, 2002

(54) COMPUTER ENCLOSURE INCORPORATING A LATCH

(75) Inventors: Alvin Liu, Pa-Li; Yu-Tai Liu, Hsin-Chuang, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/551,290

(22) Filed: Apr. 18, 2000

(30) Foreign Application Priority Data

Mar. 1, 2000 (TW) ........................................ 89203251 U

(51) Int. Cl.⁷ ................................................. H05K 7/16
(52) U.S. Cl. ...................... 361/796; 361/683; 361/725; 361/801; 312/223.2; 292/207
(58) Field of Search ................................ 361/683–686, 361/725–727, 801; 312/223.2; 292/207

(56) References Cited

U.S. PATENT DOCUMENTS

| | | | | |
|---|---|---|---|---|
| 5,112,119 A | * | 5/1992 | Cooke et al. ................ | 312/283 |
| 5,751,545 A | * | 5/1998 | Jung ........................... | 361/683 |
| 5,823,644 A | * | 10/1998 | Suh et al. ................. | 312/223.2 |
| 6,118,668 A | * | 9/2000 | Scholder et al. ............ | 361/753 |
| 6,205,020 B1 | * | 3/2001 | Felcman et al. ............ | 361/683 |

* cited by examiner

*Primary Examiner*—Jayprakash N. Gandhi
(74) *Attorney, Agent, or Firm*—Wei Te Chung

(57) ABSTRACT

A computer enclosure includes a chassis and a hood attached to the chassis. The chassis has a rear panel defining an L-shaped slot having a first section and a second section, and a pair of side panels connecting to the rear panel. The hood has a pair of side walls engaging with the side panels of the chassis for fixing the hood to the chassis. A latch is pivotably attached to one side wall of the hood and extends into the slot of the rear panel of the chassis. The latch is movable from the first section to the second section of the slot by being forcibly rotating about the pivot to securely fix the hood to the chassis.

5 Claims, 6 Drawing Sheets

COMPUTER ENCLOSURE INCORPORATING A LATCH

BACKGROUND OF THE INVENTION

1. Field of the Invention

The present invention is related to a computer enclosure, and particularly to a computer enclosure having a latch pivotably attached to a hood for readily attaching/detaching the hood to/from a chassis.

2. The Related Art

Recent trends in the computer industry include using two or more subcontractors to assemble a computer. Generally, a computer enclosure is manufactured at a first site where labor cost is low, after which other components may be assembled in the computer enclosure to finalize the computer system at a second site where labor cost is high. During the procedure of assembling the computer, a hood of the computer enclosure is attached to/detached from a chassis several times. For a conventional computer enclosure, the hood is fixed to the chassis of the computer enclosure by bolts, so the assembling/disassembling of the hood to/from the chassis is time-consuming and laborious.

To counter the above problem, Taiwan patent application No. 82212635 disclosed a hood attached to a chassis without using bolts. The hood forms two pairs of tabs and a pair of lips at stacked flanges on opposite sides thereof. The chassis has a pair of side flanges each defining a pair of slots for receiving the tabs of the hood. Thus, the lips of the hood abut against the side flanges of the chassis and the tabs of the hood engagingly extend through the slots of the chassis thereby fixing the hood to the chassis. However, the hood is fixed to the chassis so tightly that it requires a large force to detach the hood from the chassis. Furthermore, it is difficult to apply a force to the hood. So detaching the hood from the chassis of the computer enclosure is complicated.

Another example is disclosed in Taiwan patent application No. 86211252. A hood is attached to a chassis of a computer enclosure by means of a pair of actuating protrusions formed on opposite sides of the hood and two pairs of fingers respectively on opposite sides of the protrusions. The chassis forms a pair of tabs for each pair of fingers, each pair of tabs engaging with the corresponding pair of fingers of the hood, thereby fixing the hood to the chassis. However, the hood may get deformed during disengagement of the fingers from the tabs. Thus, the hood no longer closely fits the chassis after being assembled and disassembled several times. The resulting gap between the hood and the chassis may result in EMI (electromagnetic interference) problems.

SUMMARY OF THE INVENTION

Accordingly, an object of the present invention is to provide a computer enclosure having a latch for facilitating assembling/disassembling a hood to/from a chassis of the computer enclosure.

Another object of the present invention is to provide a computer enclosure having a latch for facilitating assembling/disassembling a hood to/from a chassis, while conserving EMI protection offered by the hood.

To achieve the above-mentioned objects, a computer enclosure of the present invention comprises a chassis and a hood attached to the chassis. The chassis comprises a rear panel defining a slot having a first section and a second section substantially normal to the first section, and a pair of side panels connecting to the rear panel. The hood has a pair of side walls engaging with the side panels of the chassis for fixing the hood to the chassis. A latch is pivotably attached to one side wall of the hood and movably extends into the slot. The latch is movable from the first section into the second section by being forcibly rotated about the pivot thereof for securely engaging with the slot to secure the hood to the chassis.

BRIEF DESCRIPTION OF THE DRAWINGS

Other objects and advantages of the present invention will be understood from the following description of a computer enclosure according to the preferred embodiment of the present invention as shown in the accompanying drawings, in which.

DETAILED DESCRIPTION OF THE PREFERRED EMBODIMENT

Figure 1:
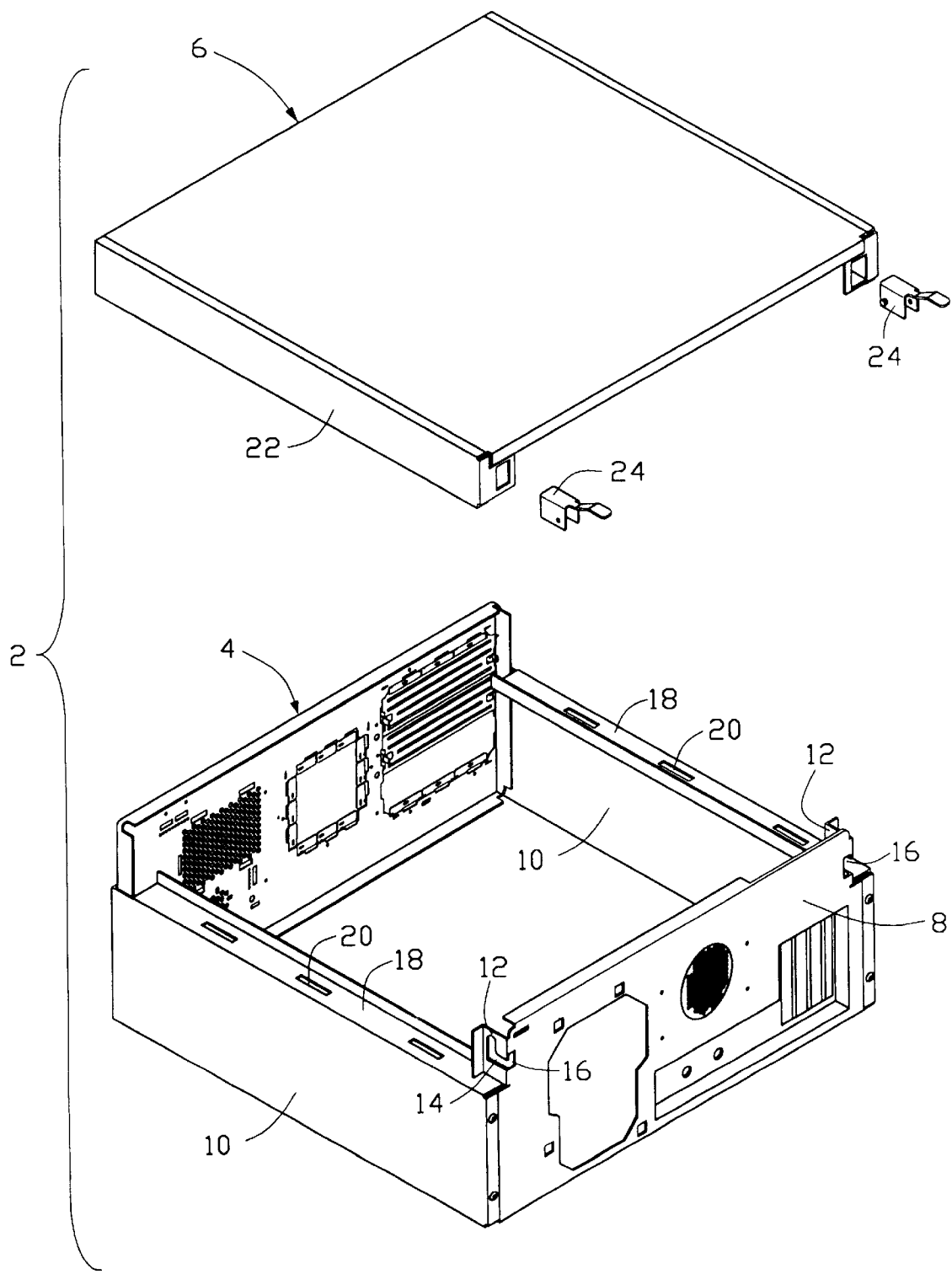
FIG. 1 is an exploded view of a computer enclosure of the present invention.

Referring to FIG. 1, a computer enclosure 2 of the present invention includes a chassis 4 and a hood 6 releasably attached to the chassis 4. The chassis 4 includes a rear panel 8 and a pair of side panels 10 connecting to opposite ends of the rear panel 8. The rear panel 8 is stamped to form a pair of bent tabs 12 on opposite side portions thereof each defining an L-shaped slot 14 having a first entry section and a second locking section. The rear panel 8 defines a pair of notches 16 in communication with the L-shaped slots 14 of the bent tabs 12. Each side panel 10 is stamped to form a top flange 18 defining three apertures 20 therein.

Figure 2:
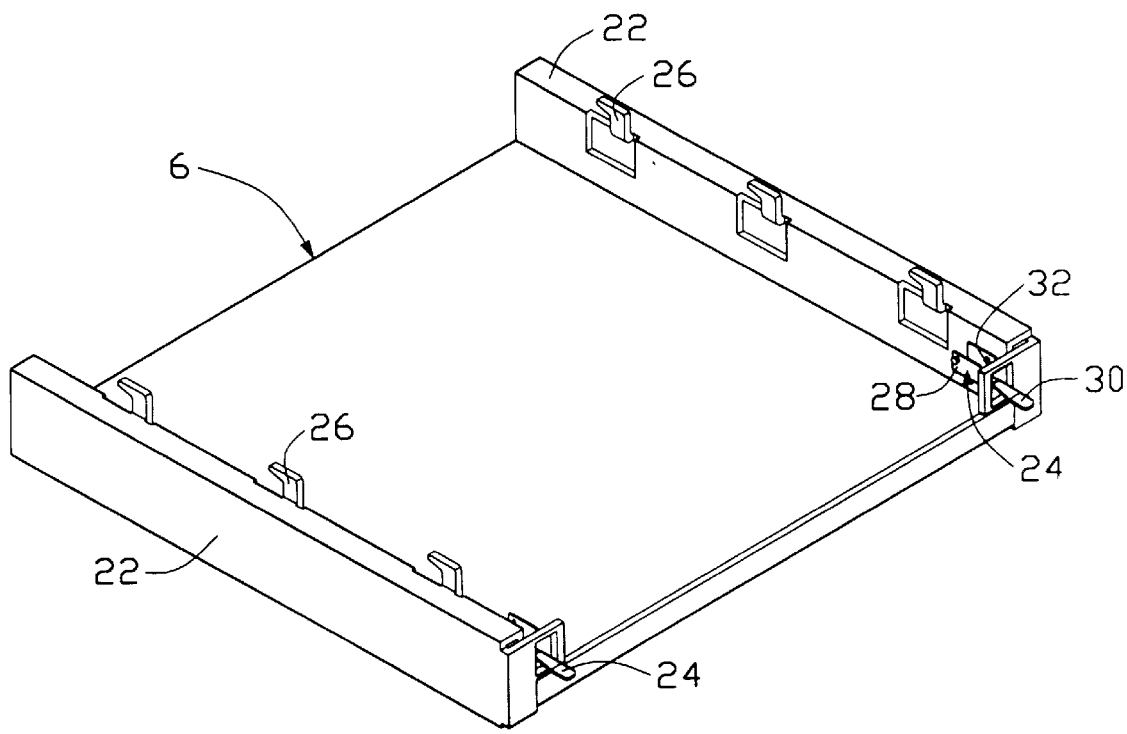
FIG. 2 is a perspective view of a hood of FIG. 1 viewed from another perspective.
Figure 3:
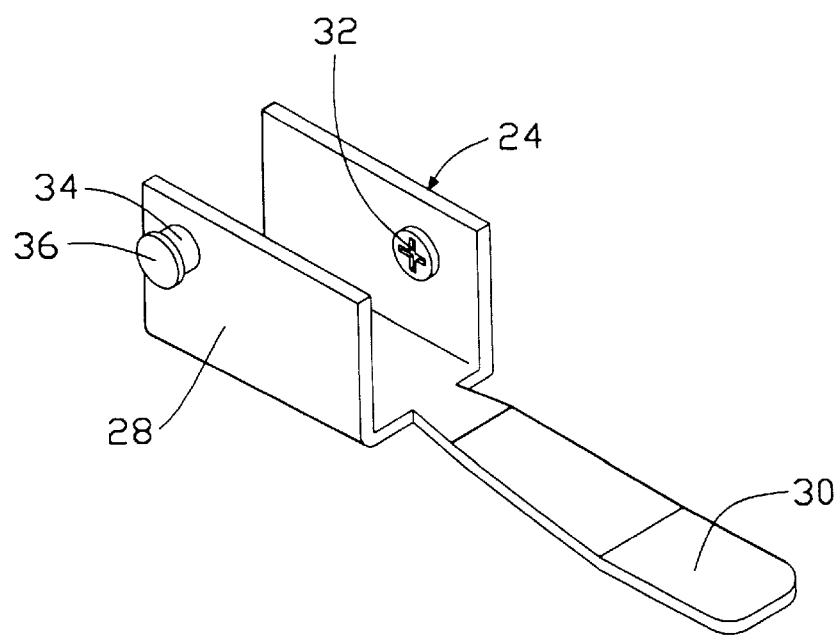
FIG. 3 is a perspective view of a latch of FIG. 2.
Figure 4:
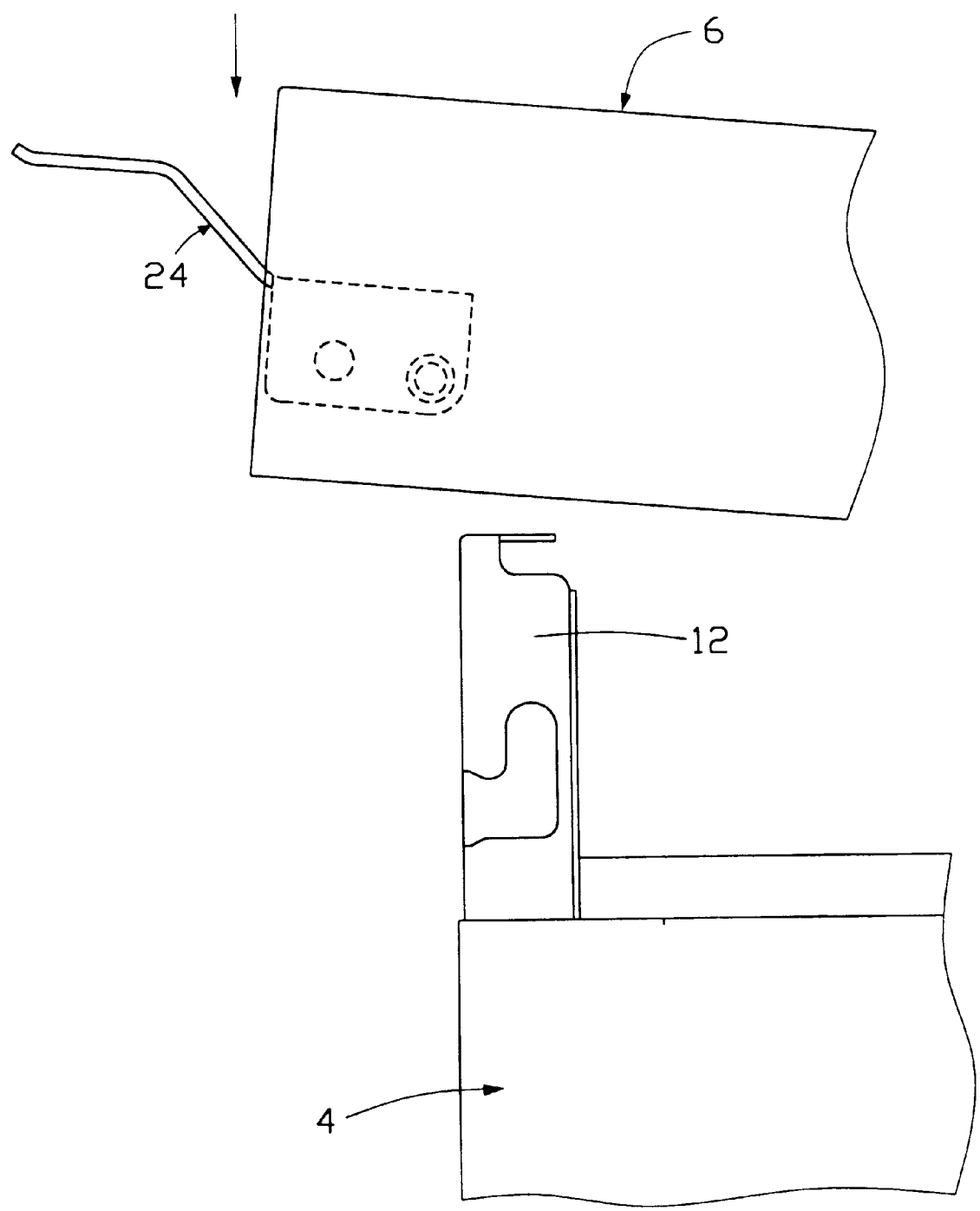
FIGS. 4–7 are schematic views of the computer enclosure showing a procedure for fixing the hood to a chassis of FIG. 1.
Figure 5:
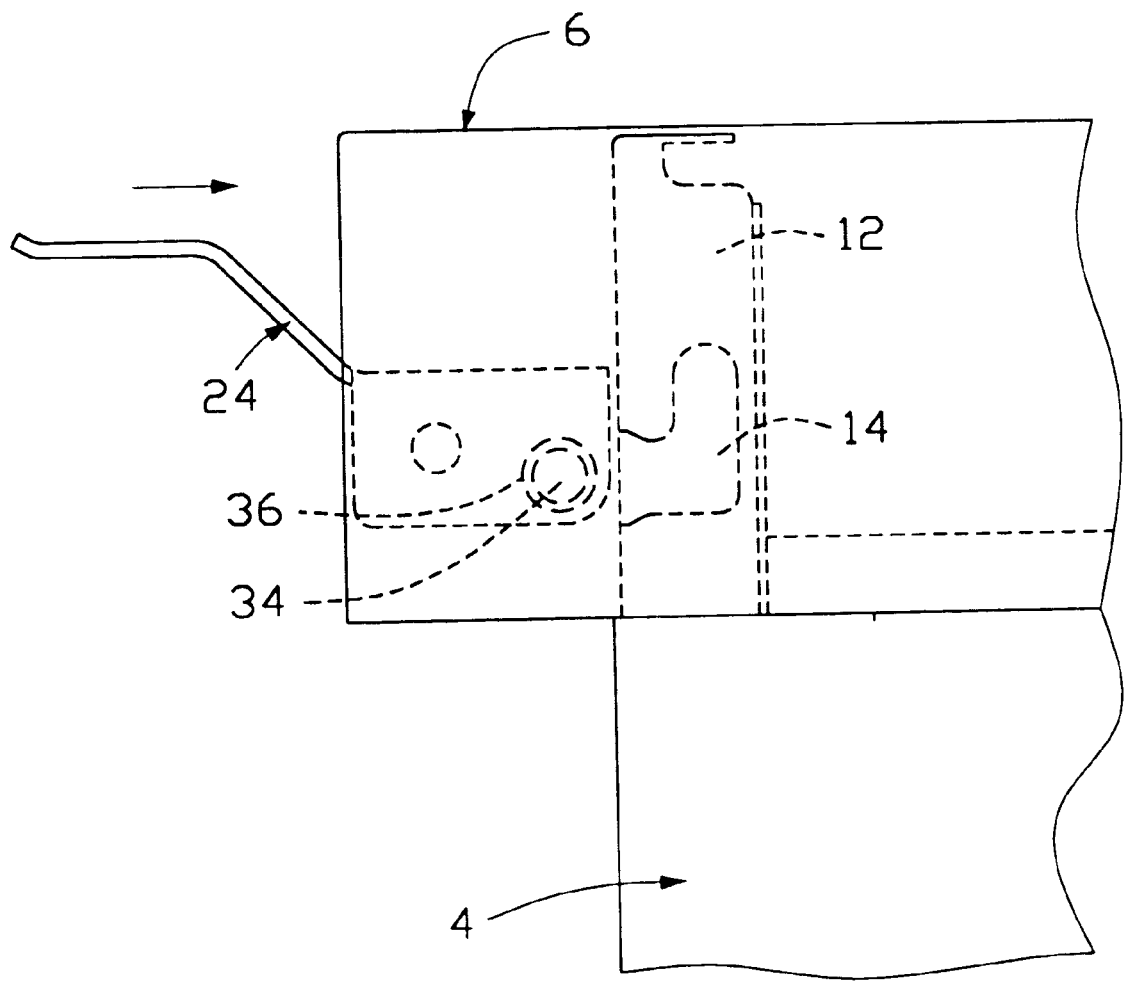
Figure 6:
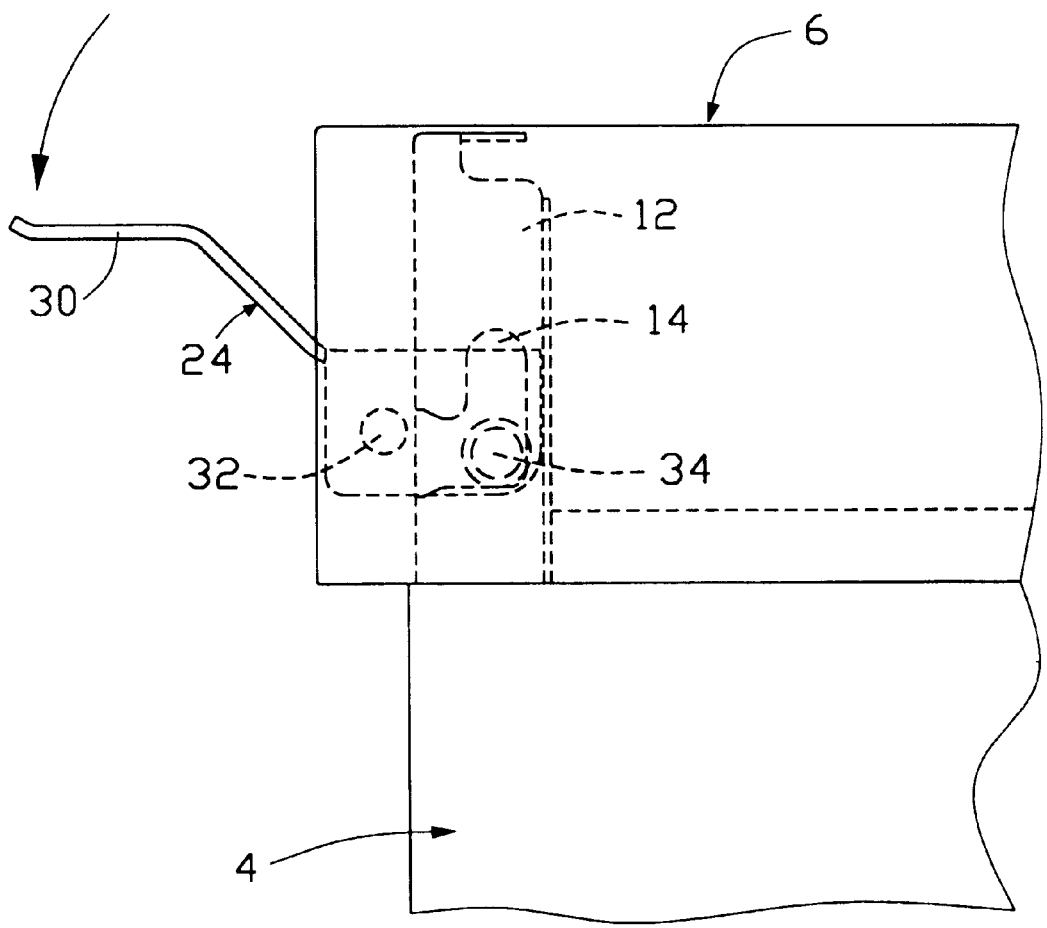
Figure 7:
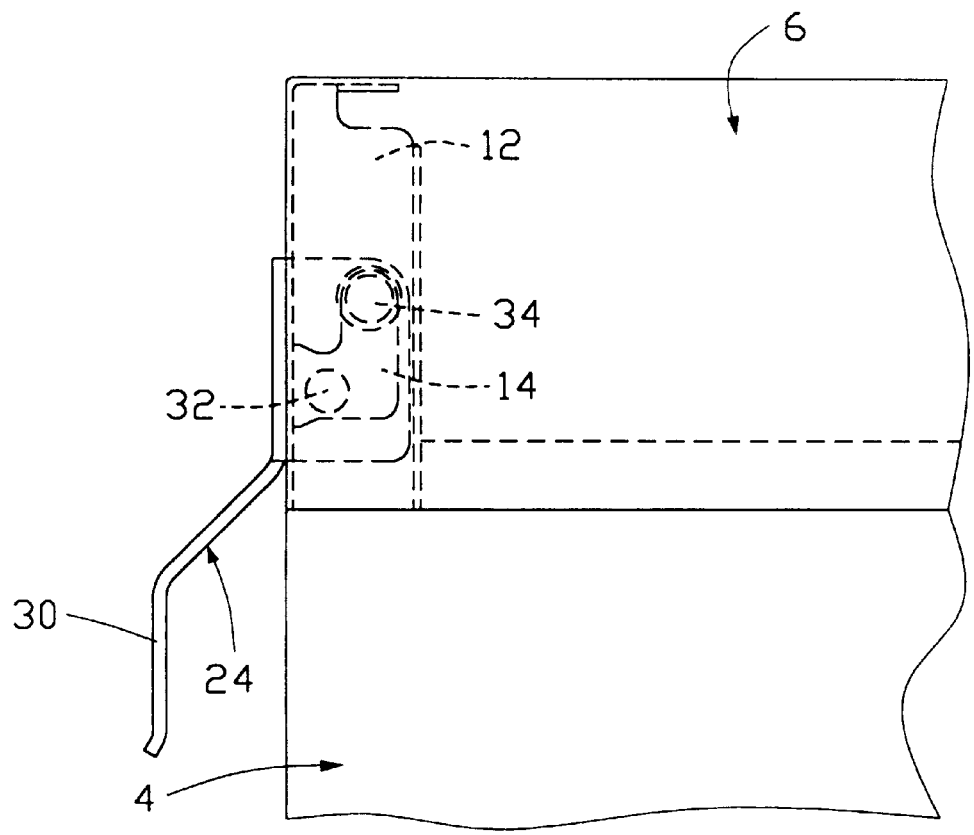

Also referring to FIGS. 2 and 3, the hood 6 includes a pair of side walls 22 to which a pair of latches 24 is pivotably attached. Each side wall 22 is stamped to form three taches 26 for extending through and engaging with the apertures 20 of the chassis 4. Each latch 24 includes a U-shaped body 28 and an actuating arm 30 extending from the body 28. The body 28 includes a pivot 32 at one side flange thereof for being pivotably attached to an inner surface of the side wall 22 of the hood 6, and a protrusion 34 at the other side flange thereof for being movably received in the L-shaped slot 14 of the chassis 4. The pivot 32 is situated between the protrusion 34 and the actuating arm 30. A cap 36 is formed at a distal end of the protrusion 34 extendable through the notch 16 in the rear panel 8 of the chassis 4.

Referring to FIGS. 4–7, the operation of attaching the hood 6 to the chassis 4 by using the latches 24 is shown. The hood 6 is positioned on the chassis 4 with the caps 36 of the latch 24 extending through the notches 16 (See FIG. 1) of the chassis 4. The protrusions 34 of the latches 24 are moved into the entry sections of the L-shaped slots 14 of the bent tabs 12 of the chassis 4. Then the actuating arms 30 of the latches 24 are actuated to make the latches 24 pivoting about the pivots 32 of the latches 24 and forcing the protrusions 34 into the locking sections of the L-shaped slots 14 of the bent tabs 12 of the chassis 4. Thus, the latches 24 engage with the bent tabs 12 of the rear panel 8 of the chassis 4 thereby readily fixing the hood 6 to the chassis 4.

Of course, in disassembly, the actuating arms 30 of the latches 24 are actuated to rotate about the pivots 32 of the latches 24 in a reverse direction to disengage the protrusions 34 from the L-shaped slots 14 of the chassis 4. Thus, the hood 6 is readily detached from the chassis 4.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A computer enclosure comprising:

a chassis comprising a rear panel defining a slot, and a pair of side panels connecting to the rear panel, the slot having a first section and a second section; and a hood attached to the chassis and having a pair of side walls engaging with the side panels of the chassis for fixing the hood to the chassis, a latch being attached to one side wall of the hood by a pivot and extending into the slot of the rear panel of the chassis, the latch being movable from the first section to the second section of the slot by being rotated about the pivot for fixing the hood to the chassis.

2. The computer enclosure as described in claim 1, wherein the slot of the rear panel is substantially L-shaped.

3. The computer enclosure as described in claim 1, wherein a top flange extends from the side panel and defines a plurality of apertures therein, and wherein the side wall of the hood forms a plurality of taches for being engagingly received in the apertures of the chassis.

4. The computer enclosure as described in claim 1, wherein the latch comprises a body pivotably attached to the side wall of the hood, and an actuating arm extending from the body for manually rotating the body to drive the latch from the first section to the second section of the slot.

5. The computer enclosure as described in claim 4, wherein a protrusion extends from the body of the latch opposite the pivot and is movably received in the slot, and wherein the pivot is located between the protrusion and the actuating arm.

* * * * *